United States Patent

Hanright et al.

[11] Patent Number: 6,088,465
[45] Date of Patent: Jul. 11, 2000

[54] DOOR-DEPENDENT SYSTEM FOR ENABLING AND ADJUSTING OPTIONS ON HEARING AIDS

[75] Inventors: William L. Hanright, Greenpond; Sunil Chojar, Lebanon, both of N.J.

[73] Assignee: Siemens Hearing Instruments, Inc., Piscataway, N.J.

[21] Appl. No.: 09/150,261

[22] Filed: Sep. 9, 1998

Related U.S. Application Data

[63] Continuation-in-part of application No. 08/640,372, Apr. 30, 1996, Pat. No. 5,799,095.
[51] Int. Cl.⁷ .................................................. H04R 25/00
[52] U.S. Cl. ........................... 381/323; 381/322; 381/328
[58] Field of Search ..................................... 381/312, 314, 381/323, 322, 324, 328, FOR 129, FOR 133, FOR 135; 439/500

[56] References Cited

U.S. PATENT DOCUMENTS

| | | | |
|---|---|---|---|
| 5,188,540 | 2/1993 | Haertl et al. | 439/500 |
| 5,588,064 | 12/1996 | McSwiggen et al. | 381/128 |
| 5,799,095 | 8/1998 | Hanright | 381/328 |

FOREIGN PATENT DOCUMENTS

| | | |
|---|---|---|
| 0 341 902 | 11/1998 | European Pat. Off. . |
| 44 44 586 | 2/1996 | Germany . |
| 444586 | 2/1996 | Germany . |
| WO 97 41710 | 11/1997 | WIPO . |

*Primary Examiner*—Huyen Le
*Attorney, Agent, or Firm*—Mark H. Jay

[57] ABSTRACT

A programmable hearing aid circuit is programmed by making electrical connections between contacts that are connected to the circuit. The connections are made by conductive region(s) located on the body of the battery door.

5 Claims, 1 Drawing Sheet

DOOR-DEPENDENT SYSTEM FOR ENABLING AND ADJUSTING OPTIONS ON HEARING AIDS

CROSS-REFERENCE TO RELATED APPLICATION

This application is a continuation-in-part of allowed patent application Ser. No. 08/640,372, filed Apr. 30, 1996 now U.S. Pat. No. 5,799,095. The entire disclosure of that patent application is hereby incorporated into this application as if fully set forth herein.

The above-referenced parent patent application discloses and claims a beside-the-door programming system. In accordance with that system, a plurality of programming terminals are connected to a programmable hearing aid circuit and are located inside the housing near the battery door opening. When the aid is to be programmed, the door is opened and a thin and flexible programming strip is introduced between the door and the faceplate. The programming strip has a plurality of electrodes that mate with the terminals. When the door is then closed, the electrodes and the terminals make electrical contact and the circuit can be programmed using an external programmer. Then, the door is opened, the programming strip is removed, and the programmed aid can be used by the patient.

It has now been realized that by adapting the structure disclosed in the above-referenced parent patent application, it is possible to enable, and to adjust, options that are provided on hearing aid circuits. This is because it is possible to bridge across selected ones of the terminals by providing conductive material on the battery door and so arranging the terminals that opening and closure of the door causes connections to be made and broken between one selected terminal and at least another one of the terminals.

Hence, in accordance with the invention, there is provided a hearing aid housing. A faceplate is attached to the housing and has an opening for receiving a battery door. An option-containing hearing aid circuit is contained inside the housing, and is connected to a plurality of programming contacts. The programming contacts are located inside the housing near the opening. A battery door is located within the opening and is hingedly connected to the faceplate. The battery door is movable between open and closed positions when so attached, and has a body located immediately adjacent said programming contacts when the door is closed. At least one electrical conductor is located on the body and is so positioned as to electrically connect at least two of the contacts when the door is closed. Hence, by opening and closing the battery door, the contacts can be connected to and disconnected from each other, thereby enabling and adjusting the options on the hearing aid circuit.

Advantageously, and in accordance with the preferred embodiment, there are a plurality of physically interchangeable doors, each being detachably securable to the faceplate and having one or more conductive regions, each possessing at least one unique characteristic. One such characteristic is shape, by which the connections between the contacts can be changed by changing the battery door. Another such characteristic is electrical resistance.

The preferred embodiment holds out the possibility of realizing substantial manufacturing economies. This is because it is possible to provide a single programmable hearing aid circuit with many different capabilities and then to deliver an appropriate instrument to the patient merely by providing the aid with the proper battery door. This would allow the manufacturer to realize economies of scale in manufacturing the circuit and would also allow the manufacturer to obtain premium prices for high-value-added features for the cost of a different battery door.

DETAILED DESCRIPTION OF PREFERRED EMBODIMENTS

Figure 1:
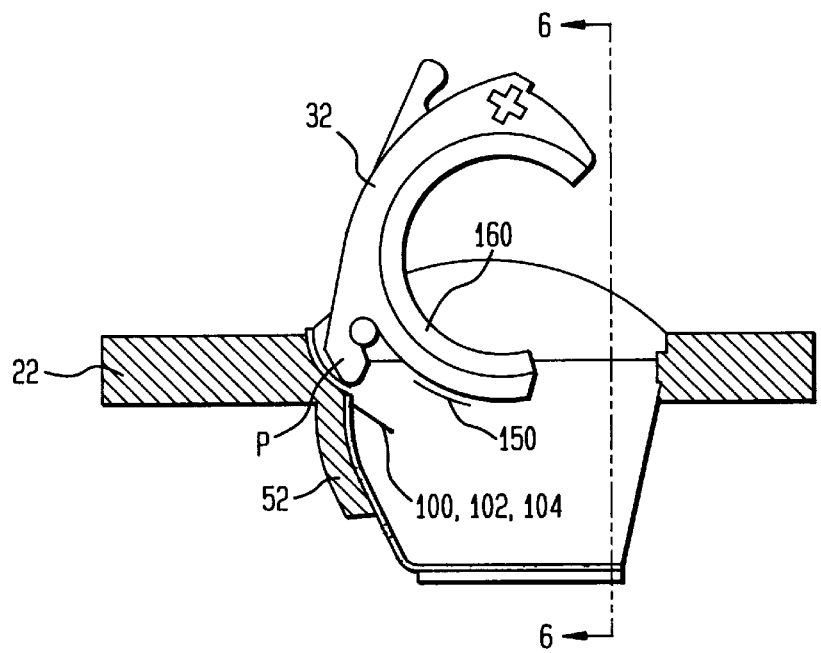
FIG. 1 shows the preferred embodiment with the battery door in the open position.
Figure 2:
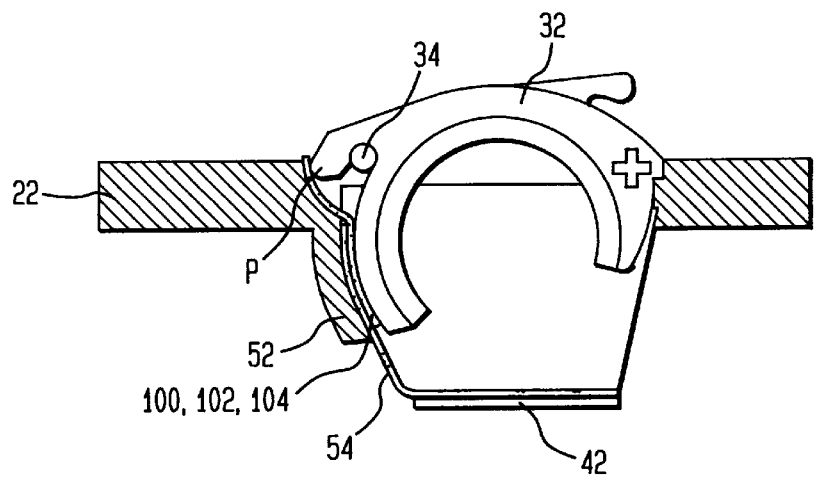
FIG. 2 shows the preferred embodiment with the battery door in the closed position.

As has been described in the parent application hereto, namely application Ser. No. 08/640,372, filed Apr. 30, 1996, a battery door 32 is hingedly secured to a faceplate 22 by a pin 34. A printed circuit board 54 permits connections to be made to a hearing aid circuit 42. In the parent application and this application, the same element is always indicated by the same reference number.

In application Ser. No. 08/640,372, filed Apr. 30, 1996, programming of the circuit 42 is carried out using a thin, flexible strip 56. However, if the circuit 42 is of the type that so permits, it is possible to program the circuit 42 by making and breaking connections between the three programming terminals.

For example, let it be assumed that the circuit 42 is the hybrid circuit now sold by Siemens Hearing Instruments, Inc. in the LIFESOUND hearing aid model. This circuit has the following option features that can be controlled by appropriate conductive or resistive regions:

1. the maximum power output, which is at its highest value when two terminals are bridged and which is reduced by interposing a resistance between the terminals;
2. the high-pass filter, which is at a maximum cut when two terminals are bridged and which is reduced by interposing a resistance between the terminals;
3. the resonant peak control, which is shifted maximally when two terminals are bridged and which is shifted to a lesser degree by interposing a resistance between the terminals;
4. the gain, which is maximum when two terminals are bridged and which is reduced by interposing a resistance between the terminals; and
5. the low-pass filter, which is at a maximum cut when two terminals are bridged and which is reduced by interposing a resistance between the terminals.

Hence, by providing an appropriate number of contacts and providing different ways of connecting them through appropriately chosen resistances, it is possible to enable different options on a particular programmable hearing aid circuit.

Figure 3:
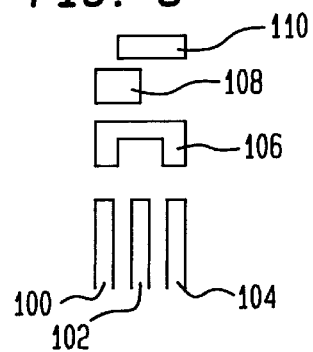
FIG. 3 illustrates exemplary conductive patterns that may be used on the battery door.

In accordance with the preferred embodiment, the electrodes 46, 48, and 50 disclosed in application Ser. No. 08/640,372, filed Apr. 30, 1996 are replaced by thin and flexible conductive contacts 100, 102, and 104. (Advantageously, these may be of stainless steel or of a gold-plated beryllium-copper alloy). To establish connections between these contacts 100, 102 and 104, a conductive region 150 (of e.g. conductive epoxy or conductive paint) is applied to the body 160 of the battery door 32. Exemplary patterns for the conductive region 150 are shown in FIG. 3. To make a connection between the contacts 100 and 102, the pattern 108 might be used. To make a connection between the contacts 100 and 104, the pattern 106 might be used. To make a connection between the contacts 102 and 104, the pattern 110 might be used. And, there is no requirement that there be only one conductive region 150 on the body 160. There can be as many such regions as needed, as long as they appropriately mate with contacts on the faceplate 22.

Although in the preferred embodiment the flexible contacts 100, 102, and 104 are located on the faceplate 22 and the conductive region 150 is located on the body 160 of the battery door 32, this need not be so. It would alternatively be possible to locate flexible contacts on the body 160 and a conductive region on the faceplate 22. And, although in the preferred embodiment the circuit 42 is an analog device, this is also not required. A programmable digital circuit can be used instead.

Although one or more preferred embodiments have been described above, the scope of the invention is limited only by the following claims.

What is claimed is:

1. A hearing aid programming system, comprising:

a hearing aid housing;

a faceplate attached to the housing and having an opening for receiving a battery door;

a hearing aid circuit contained inside the housing;

a plurality of programming contacts electrically connected to the circuit and located inside the housing near the opening;

a battery door located within the opening and being hingedly connected to the faceplate so as to be movable between open and closed positions, the door having a body located immediately adjacent said programming contacts when the door is closed; and at least one electrically conductive region rigidly and immovably fixed to the body, the region being so positioned as to electrically connect at least two of the contacts when the door is closed.

2. The system of claim 1, wherein there are a plurality of physically interchangeable doors, each door being detachably securable to the faceplate and having an electrically conductive region possessing at least one unique characteristic.

3. The system of claim 2, wherein said at least one characteristic includes shape.

4. The system of claim 2, wherein said at least one characteristic includes electrical resistance.

5. The system of claim 1, wherein there are three terminals.

* * * * *